United States Patent [19]
Close et al.

[11] Patent Number: 6,125,466
[45] Date of Patent: Sep. 26, 2000

[54] DRAM PARITY PROTECTION SCHEME

[75] Inventors: Ciaran B. Close, Dublin; Richard A. Gahan, Co. Galway; Bryan T. Campbell, Galway, all of Ireland

[73] Assignee: Cabletron Systems, Inc., Rochester, N.H.

[21] Appl. No.: 08/346,311

[22] Filed: Nov. 28, 1994

Related U.S. Application Data

[63] Continuation of application No. 07/818,611, Jan. 10, 1992, abandoned.

[51] Int. Cl.[7] .................................................. H03M 13/00
[52] U.S. Cl. .......................................... 714/758; 714/804
[58] Field of Search .................................. 371/50.1, 51.2; 714/758, 804

[56] References Cited

U.S. PATENT DOCUMENTS

| | | | |
|---|---|---|---|
| 3,183,483 | 5/1965 | Lisowski | 371/50.1 |
| 3,831,144 | 8/1974 | En | 371/50.1 |
| 3,887,901 | 6/1975 | Moore, III | 371/51.1 |
| 4,183,463 | 1/1980 | Kemmetmueller | 371/50.1 |
| 4,231,089 | 10/1980 | Lewine et al. | 395/575 |
| 4,277,844 | 7/1981 | Hancock et al. | 371/38 |
| 4,371,963 | 2/1983 | Edwards, Jr. et al. | 371/50.1 |
| 4,453,251 | 6/1984 | Osman | 371/50.1 |
| 4,464,747 | 8/1984 | Groudan et al. | 371/50.1 |
| 4,688,219 | 8/1987 | Takemae | 371/10.3 |
| 4,747,080 | 5/1988 | Yamada | 365/200 |
| 5,090,014 | 2/1992 | Polich et al. | 371/15.1 |
| 5,107,505 | 4/1992 | Lelandais et al. | 371/37.4 |

Primary Examiner—Robert W. Beausoliel, Jr.
Assistant Examiner—P. Elisca
Attorney, Agent, or Firm—Wolf, Greenfield & Sacks, P.C.

[57] ABSTRACT

A scheme for protecting memory stored in a DRAM using a combination of horizontal and vertical parity data to detect and correct errors in a protected space of memory in which code is stored. The DRAM memory of this scheme is architected with the code stored in horizontally contiguous bytes and the vertical parity, generated when the code is compiled, also stored in horizontally contiguous bytes, but in a row of DRAM memory separate from those in which the code is stored.

4 Claims, 1 Drawing Sheet

DRAM PARITY PROTECTION SCHEME

This is a continuation of application Ser. No. 07/818,611, filed Jan. 10, 1992, now abandoned.

FIELD OF INVENTION

The present invention is directed to a scheme for protecting memory stored in a DRAM using a combination of horizontal and vertical parity to detect and correct errors and architecting the memory using such a protection scheme, so as to minimize errors.

BACKGROUND OF THE INVENTION

A DRAM (dynamic RAM) is a form of semiconductor random access memory (RAM) which typically stores information in integrated circuits that contain capacitors. The dynamic RAM is called dynamic because data are stored only temporarily and must be continually rewritten or refreshed. The temporary nature of DRAM memory storage is due in part to leakage currents in the capacitive elements of the integrated circuits of which the memory is constructed. While DRAMs must be continually refreshed, the high density and low cost of the DRAMs make them advantageous memory components.

In addition to hard errors, such as physical defects that can occur in the integrated circuits forming the memory, DRAMs are susceptible to soft errors. Soft errors are believed to be caused by alpha particles emitted from within the DRAM packaging that hit cells of DRAM memory or the bit lines. These alpha particles alter the voltage of the cells or of the bit lines when data has been accessed from DRAM. When a memory cell is hit by an alpha particle, the logic level of the cell may change. When a bit line is hit as it is accessing data from memory cell, the change in voltage may be enough that the logic level will be altered as the voltage on the bit line is fed back through a transistor or other logic circuit to the memory cell.

Reports of soft errors in such DRAM memories indicate that 90% of all the soft errors are due to bit line hits, i.e., alpha particles hitting the bit lines when a row of memory is being accessed onto the bit lines. The more frequently a particular row is accessed, the higher the probability is that bits on that row will be corrupted.

Soft errors in DRAMs are particularly significant in diskless CPU systems where the code is stored in DRAMs. Typically the code is loaded into the DRAM memory when the system is booted. Soft errors if uncorrected can lead to failure, necessitating subsequent reboot of the code. If this reboot is to occur over the network then there is an indeterminate amount of time between when a failure occurs and when the software is loaded again and the system is back up and running.

The present invention uses a combination of vertical and horizontal parity error detection and correction. A combination of vertical and horizontal parity error detection and correction could present a problem because vertical parity generation and checking is time-consuming relative to a DRAM access time. This scheme is preferably applied to a smaller block of memory in the DRAM where the data is changed infrequently or never, e.g., where code is stored. The scheme of the present invention provides an environment comprising software, hardware, and a particular DRAM architecture in which a high percentage of soft errors in DRAM memory may be detected and corrected while avoiding the necessity of having to reboot the entire system.

SUMMARY OF THE INVENTION

The present invention is directed to a vertical and horizontal parity protection scheme which is applied to a protected area in which data are stored, preferably a static area of the DRAM, i.e., where data are seldom, if ever, changed, as opposed to a dynamic area where data are frequently altered.

The present invention is further directed to a scheme to significantly reduce the number of software reloads caused by soft DRAM errors in the static area in which code is stored, i.e., the code space. The present invention enables correction of a soft error occurring in the code space using horizontal and vertical parity which permits restarting of the code while avoiding the necessity to completely reload the code. This will significantly increase the uptime of a product as the code will not have to be fetched over the network and reloaded into DRAM every time a soft error occurs in the code space.

In one embodiment of the invention vertical parity bits for each column containing code are generated when the code is compiled and stored. The code is stored in a static area of the DRAM, the code space. The vertical parity bits are stored in the static area of the DRAM, separate from the code. The vertical parity bits may be stored adjacent to or appended to the code, but should be in a separate row of DRAM memory from the code.

The code space is typically small relative to the size of the DRAM, e.g., about 10% of DRAM. In one embodiment of the invention, the data stored in the code space are organized in blocks of longwords, i.e., 4 bytes or 32 bits of information. Vertical parity longwords are generated, for example, by XORing vertically consecutive longwords of code stored in the code space. Horizontal parity is generated and checked on a byte basis, for example, using a parity generator/checker or a similar device typically used in horizontal parity protection schemes.

Once the code is compiled, the vertical parity is generated and stored in the static area of the DRAM. The code is run from the DRAM and in this particular embodiment, a longword of code is addressed. The address is latched and a horizontal parity check is applied to the data in the addressed location. Horizontal parity is provided on a byte basis which permits detection of any odd number of bits in error in any/all of the bytes in the longword. If an error is detected, the latched address will serve to remember or isolate which longword contained the error. When an error is detected in a byte of the code using horizontal parity, a vertical parity check is applied to blocks of longwords in the code space to determine in which column the error exists. The row location of the error is determined by the horizontal parity check. The column location of the error is determined by the vertical parity check. The error is thus isolated to a particular bit location in which it occurs. Once an error is isolated, if the error is in a protected space, e.g., code space, correction code is run from an EPROM. The error is corrected by switching the logic level at the isolated location. The system is then restarted.

Since the vertical parity words are stored in DRAM, they are susceptible to the same corruption of soft errors as the rest of the memory. If a soft error exists in the vertical parity database, then the error in the code may go uncorrected. If a soft error occurs and is uncorrected, the system will crash and will have to be rebooted. This downtime is indeterminate as the down line load will be taking place over a network.

An additional feature of this embodiment of the invention provides for architecting the memory in a particular way so as to minimize the soft errors in the vertical parity database. Ninety percent (90%) of soft errors in any given row of DRAM are caused by accesses to that row. Thus, by keeping the number of accesses to a row to a minimum, the number of errors is kept to a minimum.

In a particular embodiment of the present invention, the code is arranged with horizontally contiguous longwords. Architecting the memory such that contiguous addresses go across a row as opposed to down a column, enables the storage of the vertical parity longwords database in its own row or rows. In this embodiment, when the vertical parity bits are generated, they are stored in rows separate from the code. They may be stored in the next row or in a row somewhere else. In normal runtime, the vertical parity rows will only be accessed during a refresh of the row or when a vertical parity check is being run. Thus, the soft errors introduced to the vertical parity longword database from accessing the rows are significantly minimized.

DETAILED DESCRIPTION

Figure 1:
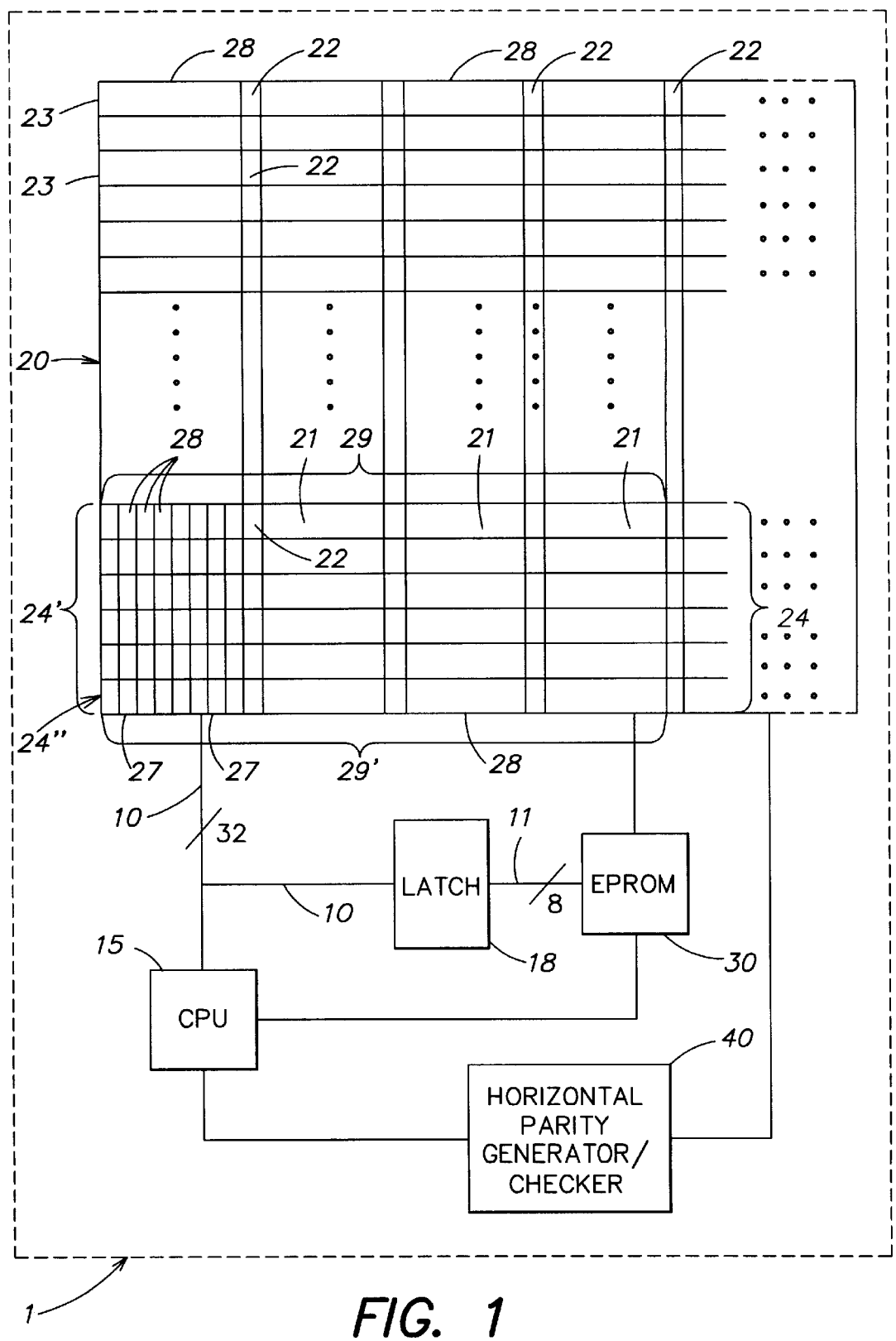
FIG. 1 illustrates a block diagram of a DRAM parity protection scheme including a memory array of the present invention.

Referring now to FIG. 1, there is illustrated the system 1 of the present invention. A CPU 15 is coupled to a 32 bit bus 10 which is coupled to a DRAM 20. The CPU 15 is also coupled by way of the 32 bit bus 10 to a latch 18. The latch 18 is coupled by way of an 8 bit bus 11 to an EPROM 30. The CPU 15 is coupled to the EPROM 30. The CPU 15 is coupled to a horizontal parity generator/checker 40 which is also coupled to the DRAM 20.

The DRAM 20 comprises an array of rows 23 and columns 28. A protected space 24 is set aside in the DRAM 20 for storage of the system's runtime code. The protected space 24 comprises a code space 24' in which runtime code is stored and a vertical parity database 24" comprising a row 23 in which vertical parity is stored. The code space 24' is arranged in blocks of longwords 29, i.e., 4 contiguous bytes 21, which are arranged in rows 23 as opposed to in columns. Each byte 21 has a corresponding horizontal parity bit 22. For each column 28 in which there is at least one byte of code stored, there is a corresponding vertical parity bit 27. These vertical parity bits 27 make up the vertical parity database 24" which is located in a row 23 separate from rows 23 in the code space 24' in which runtime code is stored.

In operation, the system 1 is booted and the CPU 15 loads code into the code space 24' of the DRAM 20. The data stored in the code space 24' are organized in blocks of longwords 29, i.e., 4 bytes or 32 bits of information. Horizontal parity bits 22 are generated and checked using the parity generator/checker 40. Horizontal parity is provided on a byte basis. A vertical parity bit 27 for each column 28 containing code is generated when the code is compiled. Vertical parity longwords 29' are generated by XORing corresponding longwords 29 of code stored in the code space 24'. For example, 256 vertically consecutive longwords are XORed to generate 1 vertical parity longword. The generated vertical parity longwords 29' are stored consecutively as such in the vertical parity database 24".

Once the code is loaded and horizontal parity bits 22 and vertical parity bits 27 are generated, the code is run and a longword 29 is addressed. The address location of the longword 29 is latched by the latch 18 and a horizontal parity check is applied by the horizontal parity generator/checker 40 to the data in the addressed location. Any odd number of bits in error in any byte 21 of the addressed longword 29 are detected.

Once an error is detected, if the error is in code space 24' correction code is run from the EPROM 30. The latched address will serve to remember or isolate which longword 29 contains the error. The horizontal parity/generator checker 40 isolates which byte(s) 21 contain an error in that longword. A vertical parity check is then applied to the columns 28 in the code space 24' of the addressed longword 29 to determine which bit of the byte(s) 21 contains the error, i.e., in which column 28, the error exists. The row location of the error is determined by the horizontal parity check. The column location of the error is determined by the vertical parity check. The error is thus isolated to a particular bit location in which it occurs. The error is then corrected by switching the logic level at the isolated bit in which the error occurred. Such correction may be effected, for example, by use of an error correction code. The system 1 is then restarted.

What is claimed is:

1. A DRAM memory comprising:

a plurality of memory storage cells arranged in an array of rows and columns;

a protected memory space comprising a subset of the rows and the columns of memory storage cells wherein data and horizontal parity bits for the data are stored, and a vertical parity database wherein vertical parity bits are stored;

the data stored in the protected memory space being arranged in rows of horizontally contiguous bytes;

the vertical parity bits being arranged in a row separate from the rows of horizontally contiguous bytes of data;

each of the vertical parity bits relating to a corresponding one of the subset set of columns in which at least one bit of data is stored;

each of the vertical parity bits being generated from the data stored in the corresponding column of data to which the vertical parity bit relates, and each of the vertical parity bits reflecting parity of the corresponding column of data;

wherein at least one byte of the data is accessed by an address and checked for horizontal parity;

wherein when the horizontal parity of at least one of the bytes shows an error exists, a row location of the error is determined by the address and a vertical parity check is run for the at least one of the bytes addressed to determine a column location of the error, the row location and the column location defining a particular bit location of the error.

2. The DRAM memory of claim 1 wherein said protected memory space comprises a code space, and said data stored in said code space comprises code.

3. The DRAM memory of claim 1 wherein said subset of the rows and columns includes all of said plurality of memory storage cells.

4. The DRAM of claim 1, further comprising error correction code to correct the particular bit location having an error by changing the logic level of the particular location.

* * * * *